United States Patent
Chen et al.

(10) Patent No.: US 11,042,101 B2
(45) Date of Patent: Jun. 22, 2021

(54) VERTICAL CONTROL METHOD FOR USE IN LITHOGRAPHY MACHINE

(71) Applicant: SHANGHAI MICRO ELECTRONICS EQUIPMENT (GROUP) CO., LTD., Shanghai (CN)

(72) Inventors: Dan Chen, Shanghai (CN); Xianying Wang, Shanghai (CN); Zhiyong Yang, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/494,097

(22) PCT Filed: Mar. 14, 2018

(86) PCT No.: PCT/CN2018/078930
§ 371 (c)(1),
(2) Date: Sep. 13, 2019

(87) PCT Pub. No.: WO2018/166462
PCT Pub. Date: Sep. 20, 2018

(65) Prior Publication Data
US 2020/0272062 A1    Aug. 27, 2020

(30) Foreign Application Priority Data
Mar. 15, 2017    (CN) .......................... 201710154051.3

(51) Int. Cl.
G03F 7/20    (2006.01)
G03F 9/00    (2006.01)

(52) U.S. Cl.
CPC ...... *G03F 7/70641* (2013.01); *G03F 7/70275* (2013.01); *G03F 7/70258* (2013.01);
(Continued)

(58) Field of Classification Search
CPC . G03F 7/70275; G03F 7/70641; G03F 9/7026
See application file for complete search history.

(56) References Cited

U.S. PATENT DOCUMENTS

| 7,327,465 B2 | 2/2008 | Hill |
| 2005/0088636 A1* | 4/2005 | Kurosawa ............. G03F 9/7026 355/53 |

FOREIGN PATENT DOCUMENTS

| CN | 102033438 A | 4/2011 |
| CN | 102486623 A | 6/2012 |

(Continued)

*Primary Examiner* — Michelle M Iacoletti
(74) *Attorney, Agent, or Firm* — Muncy, Geissler, Olds & Lowe, P.C.

(57) ABSTRACT

A method for vertical control of a lithography machine includes step 1, prior to a scanning exposure, controlling vertical measurement sensors to measure workpiece to obtain overall surface profile data of the workpiece; step 2, performing a global leveling based on the overall surface profile data of the workpiece; and step 3, during the scanning exposure of each exposure field, measuring a local surface profile of the workpiece in real time by the vertical measurement sensors and controlling at least one of a mask stage, a workpiece stage and a projection objective to move vertically according to a Z-directional height value, an Rx-directional tilt value and an Ry-directional tilt value corresponding to the local surface profile of the workpiece, to compensate for the local surface profile of the workpiece in real time, so that an upper surface of each exposure field coincides with a reference focal plane for the exposure field. This method enables flexible vertical control with high accuracy by providing multiple control options.

20 Claims, 9 Drawing Sheets

(52) U.S. Cl.
CPC ........ *G03F 7/70725* (2013.01); *G03F 9/7026* (2013.01); *G03F 9/7034* (2013.01)

(56) References Cited

FOREIGN PATENT DOCUMENTS

| | | | |
|---|---|---|---|
| CN | 105892241 | A | 8/2016 |
| CN | 106154759 | A | 11/2016 |
| JP | H08227854 | A | 9/1996 |
| JP | H08330219 | A | 12/1996 |
| JP | H11168050 | A | 6/1999 |
| JP | 2006261418 | A | 9/2006 |
| JP | 2010135803 | A | 6/2010 |
| JP | 2013077677 | A | 4/2013 |
| TW | 200538884 | A | 12/2005 |
| TW | 201218248 | A | 5/2012 |

\* cited by examiner

VERTICAL CONTROL METHOD FOR USE IN LITHOGRAPHY MACHINE

TECHNICAL FIELD

The present disclosure relates to the field of semiconductor, in particular, to a method for vertical control of a lithography machine.

BACKGROUND

A lithography system includes, from the top to the bottom, an illumination system, a mask mechanism for supporting a mask, an objective group and a workpiece stage mechanism for supporting a workpiece (i.e., a substrate). During processes of lithography, illumination light propagates successively through the mask mechanism and the objective group and then reaches the workpiece.

For the lithography system, the workpiece may have surface irregularities that can be categorized into overall surface profile and local surface profile. Overall surface profile refers to overall profile aberrations of an upper surface of the substrate and corresponds to low-frequency components of the substrate surface profile, while local surface profile refers to peaks and valleys in the upper surface within a static angular field and corresponds to high-frequency components of the substrate surface profile.

In order to adapt to the surface profile of the substrate, the lithography process often employs a vertical control method for enhancing lithography accuracy. In conventional vertical control methods, an XYZ three-dimensional coordinate system is typically first established, and a three-point global leveling is then performed, in which three points on the workpiece, such as the apices A, B and C of an equilateral triangle, as shown in FIG. 1, may be chosen and measured for their Z-positions. The measurements may be fitted to determine the values of Z, Rx and Ry of the workpiece, and the workpiece may be then adjusted according to the values of Z, Rx and Ry. Adjustment to a single exposure field is no longer performed during the process of scanning exposure in the exposure fields.

According to the conventional methods, the needs of a lithography machine for exposure can be basically satisfied in the case that the workpiece has small sizes and the objective has a large focal depth. However, the development of workpieces (e.g., glass substrates) toward larger sizes tends to be popular, and in this case, the conventional methods may be difficult to satisfy the vertical control requirements of a lithography machine.

SUMMARY OF THE DISCLOSURE

In view of the above problems, the present disclosure proposes a method for vertical control of a lithography machine, which can be carried out in different vertical control modes adapted to various conditions, thus enabling control of the lithography machine with enhanced flexibility and accuracy.

The present disclosure provides a method for vertical control of a lithography machine, comprising the steps of:

step 1, prior to a scanning exposure, controlling vertical measurement sensors to measure a workpiece to obtain overall surface profile data of the workpiece;

step 2, performing a global leveling based on the overall surface profile data of the workpiece; and step 3, during the scanning exposure of each exposure field, measuring a local surface profile of the workpiece in real time by the vertical measurement sensors and controlling at least one of a mask stage, a workpiece stage and a projection objective conduct a vertical movement according to a Z-directional height value, an Rx-directional tilt value and an Ry-directional tilt value corresponding to the local surface profile of the workpiece, to compensate for the local surface profile of the workpiece in real time, so that an upper surface of each exposure field coincides with a reference focal plane for the exposure field.

Further, step 2 comprises: fitting the surface profile data of the workpiece to obtain a global plane surface profile; and deriving vertical movement control parameters for the global leveling based on differences between the global plane surface profile and a target plane for the global leveling, and controlling, prior to the exposure, vertical movements of the workpiece stage to perform an overall global leveling according to the vertical movement control parameters for the global leveling, and wherein the target plane for the global leveling is an optimum focal plane for the projection objective.

Further, step 2 comprises: prior to the scanning exposure of each exposure field, performing fitting based on the surface profile data to obtain a local wedge for each exposure field; and controlling the workpiece supported by the workpiece stage to conduct a field-by-field global leveling based on the local wedge for each exposure field.

Further, step 2 comprises: prior to scanning exposure of each exposure field, performing fitting based on the overall surface profile data to obtain a local wedge for each exposure field; dividing a Z-directional height value corresponding to the local wedge by square of a magnification of the projection objective, dividing an Rx-directional tilt value corresponding to the local wedge by the magnification of the projection objective, and dividing an Ry-directional tilt value corresponding to the local wedge by the magnification of the projection objective, so that an image-to-object conversion of the local wedge is accomplished; controlling the mask stage to conduct a field-by-field global leveling based on the local wedge after image-to-object conversion.

Further, step 2 further comprises: during scanning exposure of each exposure field, controlling the projection objective to move along an orthogonal polynomial path to compensate for the local surface profile of the workpiece.

Further, performing fitting based on the overall surface profile data to obtain a local wedge for each exposure field comprises:

performing a curved surface fitting to the overall surface profile data to obtain a curved surface profile of the workpiece, based on which, the local wedge for each exposure field is obtained from a first-order Taylor expansion performed at a center of each exposure field.

Further, prior to scanning exposure each exposure field, performing fitting based on the overall surface profile data to obtain a local wedge for each exposure field and controlling the workpiece supported by the workpiece stage to conduct a field-by-field global leveling based on the local wedge for each exposure field comprises:

performing a curved surface fitting to the overall surface profile data to obtain a curved surface profile of the workpiece, based on which, a linear interpolation is performed to obtain interpolated points distributed throughout an upper surface of the workpiece; mapping corresponding ones of the interpolated points to each exposure field; in each exposure field, performing plane fitting to the mapped interpolated points within a static angular field moving from a start point to a finish point of the exposure field to obtain vertical movement fitted values of the exposure field during movement of the static angular field; performing orthogonal polynomials fitting based on the vertical movement fitted values to obtain an orthogonal polynomial path of the workpiece stage in Z direction, Rx direction, and Ry direction; and controlling the workpiece stage to move according to the orthogonal polynomial path to perform the field-by-field global leveling.

Further, performing fitting based on the overall surface profile data to obtain a local wedge for each exposure field comprises:

performing a plane fitting to the overall surface profile data to obtain a global plane surface profile of the workpiece; calculating differences between the global plane surface profile and a target plane for the global leveling; subtracting the differences from the overall surface profile data of the workpiece to obtain a set $\phi'$ of points; mapping corresponding ones of the points in the set $\phi'$ to each exposure field; and performing plane fitting to data of the exposure field to obtain the local wedge for the exposure field, wherein the target plane for the global leveling is an optimum focal plane for the projection objective.

Further, the lithography machine comprises a plurality of projection objectives, and the target plane for the global leveling is an average of optimum focal planes for the plurality of projection objectives.

Further, controlling the projection objective to move along an orthogonal polynomial path to compensate for the local surface profile of the workpiece comprises:

removing the local wedge for the exposure field from the set $\phi'$; performing plane fitting to the data in the static angular field moving from a start point to a finish point of the exposure field, to obtain vertical movement fitted values of the exposure field during movement of the static angular field; performing orthogonal polynomials fitting based on the vertical movement fitted values to obtain an orthogonal polynomial path of the workpiece stage in Z direction, Rx direction, and Ry direction; and controlling the optimum focal plane for the projection objective to move according to the orthogonal polynomial path to compensate for the local surface profile of the workpiece within the static angular field.

Further, the orthogonal polynomial comprises a basis function derived from Legendre polynomials, Chebyshev polynomials or Gram-Schmidt orthogonalization.

Further, step 3 comprises configuring the mask stage to move vertically to compensate for the Z-directional height value corresponding to the local surface profile of the workpiece, wherein the compensation of the Z-directional height value comprises:

applying, to the mask stage at a start point of each exposure field, a Z-directional adjustment in an amount of $1/N^{2}*(FLS.Z_{1}-BF\_Die.Z)$, where $FLS.Z_{1}$ represents a Z-directional height value of the surface profile data obtained by the vertical measurement sensors at the start point of the exposure field; BF_Die.Z represents a Z-directional set value for an optimum focal plane for the exposure field; and N represents a magnification of the projection objective; and applying, to the mask stage during the scanning exposure, a Z-directional adjustment in an amount of $1/N^{2}*(FLS.Z_i-FLS.Z_{i-1})$, where $FLS.Z_i$ represents a Z-directional height value of the surface profile data obtained by the vertical measurement sensors within a current sampling cycle; $FLS.Z_{i-1}$ represents a Z-directional height value of the surface profile data obtained by the vertical measurement sensors within a previous sampling cycle; and N represents the magnification of the projection objective.

Further, step 3 comprises configuring the mask stage to move vertically to compensate for the Rx-directional tilt value corresponding to the local surface profile of the workpiece, wherein the compensation of the Rx-directional tilt value comprises:

applying, to the mask stage at a start point of each exposure field, an Rx-directional adjustment in an amount of $1/N*(FLS.Rx_1-BF\_Die.Rx)$, where $FLS.Rx_1$ represents an Rx-directional tilt value of the surface profile data obtained by the vertical measurement sensors at the start point of the exposure field; BF_Die.Rx represents an Rx-directional set value for an optimum focal plane for the exposure field; and N represents a magnification of the projection objective; and applying, to the mask stage during the scanning exposure, an Rx-directional adjustment in an amount of where represents $1/N*(FLS.Rx_i-FLS.Rx_{i-1})$, $FLS.Rx_i$ represents an Rx-directional tilt value of the surface profile data obtained by the vertical measurement sensors within a current sampling cycle; $FLS.Rx_{i-1}$ represents an Rx-directional tilt value of the surface profile data obtained by the vertical measurement sensors within a previous sampling cycle; and N represents the magnification of the projection objective.

Further, step 3 comprises configuring the mask stage to move vertically to compensate for the Ry-directional tilt value corresponding to the local surface profile of the workpiece, wherein the compensation of the Ry-directional tilt value comprises:

applying, to the mask stage at a start point of each exposure field, an Ry-directional adjustment in an amount of $1/N*(FLS.Ry_1-BF\_Die.Ry)$, where $FLS.Ry_1$ represents an Ry-directional tilt value of the surface profile data obtained by the vertical measurement sensors at the start point of the exposure field; BF_Die.Ry represents an Ry-directional set value for an optimum focal plane for the exposure field; and N represents a magnification of the projection objective; and applying, to the mask stage during the scanning exposure, an Ry-directional adjustment in an amount of $1/N*(FLS.Ry_i-FLS.Ry_{i-1})$, where $FLS.Ry_i$ represents an Ry-directional tilt value of the surface profile data obtained by the vertical measurement sensors within a current sampling cycle; $FLS.Ry_{i-1}$, an Ry-directional tilt value of the surface profile data obtained by the vertical measurement sensors within a previous sampling cycle; and N represents the magnification of the projection objective.

Further, during scanning exposure of each exposure field, actual vertical movement values of the mask stage are obtained by adding vertical movement set values for movements of the mask stage towards a calibrated nominal plane of the workpiece and the amounts of adjustment for compensating for the local surface profile of the workpiece.

Further, during scanning exposure of each exposure field, actual vertical movement values of the mask stage are obtained by adding vertical movement set values for movements of the mask stage towards a calibrated nominal plane of the workpiece and the amounts of adjustment for compensating for the local surface profile of the workpiece, which have been filtered.

Further, step 3 comprises configuring the workpiece stage to move vertically to compensate for the Z-directional height value corresponding to the local surface profile of the workpiece, wherein the compensation of the Z-directional height value comprises:

applying, to the workpiece stage during the scanning exposure, a Z-directional adjustment in an amount of $(FLS.Z_i-BF\_Die.Z)$, where $FLS.Z_i$ represents a Z-directional height value of the surface profile data obtained by the vertical measurement sensors within the current sampling cycle, and BF_Die.Z represents a Z-directional set value of an optimum focal plane for the exposure field.

18. The method for vertical control of a lithography machine according to claim 1, wherein step 3 comprises configuring the workpiece stage to move vertically to compensate for the Rx-directional tilt value corresponding to the local surface profile of the workpiece, wherein the compensation of the Rx-directional tilt value comprises:

applying, to the workpiece stage during the scanning exposure, an Rx-directional adjustment in an amount of $(FLS.X_i-BF\_Die.X)$, where $FLS.X_i$ represents an Rx-directional tilt value of the surface profile data obtained by the vertical measurement sensors within the current sampling cycle, and BF_Die.X represents an Rx-directional set value of an optimum focal plane for the exposure field.

Further, step 3 comprises configuring the workpiece stage to move vertically to compensate for the Ry-directional tilt value corresponding to the local surface profile of the workpiece, wherein the compensation of the Ry-directional tilt value comprises:

applying, to the workpiece stage during the scanning exposure, an Ry-directional adjustment in an amount of $(FLS.Y_i-BF\_Die.Y)$, where $FLS.Y_i$ represents an Ry-directional tilt value of the surface profile data obtained by the vertical measurement sensors within the current sampling cycle, and BF_Die.Y represents an Ry-directional set value of an optimum focal plane for the exposure field.

Further, controlling the projection objective to move along an orthogonal polynomial path comprises: controlling a lens in the projection objective to move vertically so that an optimum focal plane for the projection objective moves along the orthogonal polynomial path.

Further, controlling the projection objective to move along an orthogonal polynomial path comprises: controlling lenses in a moveable lens group of the projection objective to move horizontally relative to one another so that an optimum focal plane for the projection objective moves along the orthogonal polynomial path.

Further, the vertical movement comprises one or combinations of Z-directional movements, Rx-directional movements and Ry-directional movements, and wherein in step 3, controlling at least one of a mask stage, a workpiece stage and a projection objective to move vertically according to a Z-directional height value, an Rx-directional tilt value and an Ry-directional tilt value corresponding to the local surface profile of the workpiece comprises any one of modes as follows:

the workpiece stage is configured to move vertically to compensate for the Z-directional height value, the Rx-directional tilt value and the Ry-directional tilt value corresponding to the local surface profile of the workpiece; and at same time, the mask stage is configured to move towards a calibrated nominal plane of the workpiece; or the workpiece stage is configured to move vertically to compensate for the Z-directional height value and the Ry-directional tilt value corresponding to the local surface profile of the workpiece; and at same time, the mask stage is configured so that a Z-directional degree of freedom of the mask stage moves towards a calibrated nominal plane of the workpiece, and the mask stage is configured to move vertically to compensate for the Rx-directional tilt value and the Ry-directional tilt value corresponding to the local surface profile of the workpiece; or the workpiece stage is configured to move vertically to compensate for the Z-directional height value, the Rx-directional tilt value and the Ry-directional tilt value corresponding to the local surface profile of the workpiece; and at same time, the mask stage is configured so that a Z-directional degree of freedom of the mask stage moves towards a calibrated nominal plane of the workpiece, and the mask stage is configured to move vertically to compensate for the Ry-directional tilt value corresponding to the local surface profile of the workpiece; or the workpiece stage is configured to move towards a target plane for the global leveling; and at same time the mask stage is configured to move vertically to compensate for the Z-directional height value, the Rx-directional tilt value and the Ry-directional tilt value corresponding to the local surface profile of the workpiece; or an optimum focal plane for the projection objective is configured to move vertically to compensate for the Z-directional height value, the Rx-directional tilt value and the Ry-directional tilt value corresponding to the local surface profile of the workpiece.

Compared to the prior art, the present disclosure offers the following advantages:

1. It proposes vertical control by means of adjusting the mask stage, which is lighter in weight and hence allows a higher bandwidth, compared to the workpiece stage. Vertical movement of the mask stage can compensate for high-frequency components in the workpiece surface profile irregularities, thus overcoming the problems in vertical control of large workpieces during scanning exposure.

2. It also proposes vertical control by means of adjusting a combination of the mask stage with the projection objective and the workpiece stage, providing additional options for vertical control.

3. It further proposes a configuration table, which allows flexible choice of vertical control modes, further allowing an accuracy of vertical control.

Figure 1:
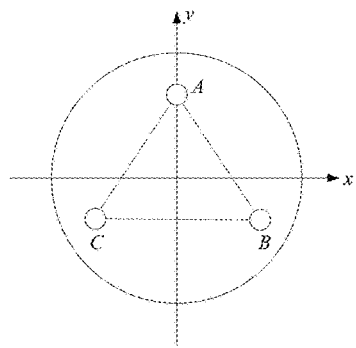
FIG. 1 schematically illustrates the choice of measurement points in a conventional vertical control method.

In these figures, 1 denotes an illumination system; 2 denotes a photomask; 3 denotes a mask stage; 3a denotes a mask-stage vertical actuator; 3b denotes a mask-stage damper; 4 denotes a projection objective; 41 denotes a lens; 42 denotes a reference focal plane; 5 denotes a vertical measurement sensor; 6 denotes a workpiece; 7 denotes a workpiece stage; 7a denotes a workpiece-stage vertical actuator; 7b denotes a workpiece-stage damper; 8 denotes a marble table; and 9 denotes a base frame.

DETAILED DESCRIPTION

The above objects, features and advantages of the present disclosure will become more apparent and better understood from the following detailed description of several specific embodiments, which is to be read in connection with the accompanying drawings.

The present disclosure provides a method for vertical control of a lithography machine, comprising:

Step 1, prior to a scanning exposure, controlling vertical measurement sensors to measure the workpiece to obtain overall surface profile data of the workpiece;

Step 2, performing a global leveling based on the overall surface profile data of the workpiece; and Step 3, during the scanning exposure of each exposure field, measuring a local surface profile of the workpiece (i.e., the surface profile of a portion of the workpiece within the exposure field) in real time by the vertical measurement sensors, and controlling at least one of a mask stage, a workpiece stage and a projection objective to move vertically, i.e., to conduct a vertical movement, according to height values in Z direction, tilt values about the X-axis (Rx direction) and tilt values about the Y-axis (Ry direction) in the local surface profile of the workpiece, to compensate for the local surface profile of the workpiece in real time, so that in each exposure field, a top surface of the workpiece coincides with a reference focal plane for the exposure field, that is, the local surface profile (corresponding to the exposure field) coincides with the reference focal plane for the exposure field.

The target plane for the global leveling is an optimum focal plane of the projection objective.

In embodiments disclosed herein, the vertical movement of the projection objective may be understood as a vertical movement of the optimum focal plane of the projection objective. Additionally, the vertical movement of each of the mask stage, the workpiece stage and the projection objective (i.e., the optimum focal plane therefor) is intended to include any one or combinations of its movement in the Z, Rx and Ry directions.

Further, in step 3, the process of controlling at least one of the a mask stage, a workpiece stage and a projection objective to conduct a vertical movement, according to Z-directional height values, Rx-directional tilt values and Ry-directional tilt values in the local surface profile of the workpiece may mainly include the vertical control modes as follows:

Mode 1: configuring the optimum focal plane of the projection objective to move vertically to compensate for the Z-directional height value, Rx-directional tilt value and the Ry-directional tilt value in the local surface profile of the workpiece;

Mode 2: configuring the mask stage to move vertically to compensate for the Z-directional height value, the Rx-directional tilt value and the Ry-directional tilt value in the local surface profile of the workpiece, and simultaneously configuring the workpiece stage to move towards the target plane for the global leveling;

Mode 3: configuring the workpiece stage to move vertically to compensate for the Z-directional height value, the Rx-directional tilt value and the Ry-directional tilt value in the local surface profile of the workpiece, and simultaneously configuring mask stage to move towards a calibrated nominal plane of the workpiece;

Mode 4: configuring the workpiece stage to move vertically to compensate for the Z-directional height value and the Ry-directional tilt value in the local surface profile of the workpiece, and simultaneously configuring the mask stage to move, with its single degree of freedom (Z direction) changing, towards the calibrated nominal plane of the workpiece, and configuring the mask stage to move vertically to compensate for the Rx-directional tilt value and the Ry-directional tilt value in the local surface profile of the workpiece;

Mode 5: configuring the workpiece stage to move vertically to compensate for the Z-directional height value, the Rx-directional tilt value and the Ry-directional tilt value in the local surface profile of the workpiece, and simultaneously configuring the mask stage to move, with its single degree of freedom (Z direction) changing, towards the calibrated nominal plane of the workpiece, and configuring the mask stage to move vertically to compensate for the Ry-directional tilt value in the local surface profile of the workpiece.

The present disclosure is not limited to these five modes, and it is apparent that those skilled in the art can make various modifications and variations to the disclosure without departing from the spirit and scope thereof. Accordingly, the disclosure is intended to embrace all such modifications and variations if they fall within the scope of the appended claims and equivalents thereof.

Embodiment 1

Figure 2:
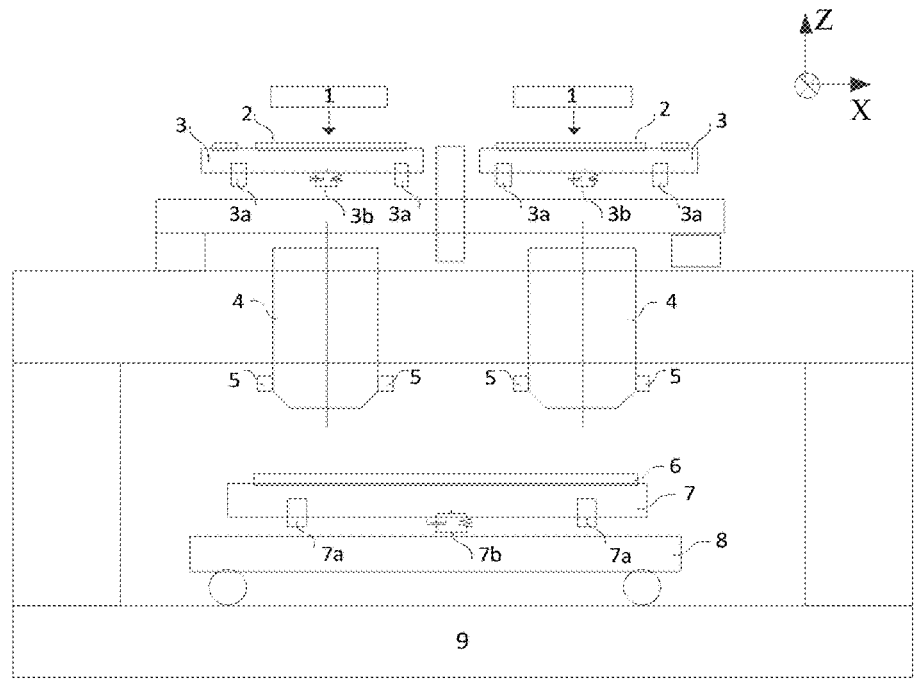
FIG. 2 is a structural schematic of a lithography machine equipped with multiple mask stages under vertical control according to a first embodiment of the present disclosure.

Referring to FIG. 2, a method for vertical control of a lithography machine provided in this embodiment is based on the operation of the lithography machine as shown in FIG. 2. The lithography machine mainly includes, from the top to the bottom, illumination systems 1, mask stages 3, projection objectives 4, a workpiece stage 7 and a marble table 8. The lithography machine may further include a base frame 9 and a host.

The illumination systems 1 may be configured to provide illumination light.

Photomasks 2 may be placed on the mask stages 3. In embodiments disclosed herein, on a surface of each of the mask stages 3 far away from the photomask 2, i.e., a bottom surface thereof, mask-stage vertical actuators 3a and a mask-stage damper 3b may be provided. The mask-stage vertical actuators 3a may be configured to control the mask stage 3 to move vertically, while the mask-stage damper 3b may be adapted to damp vibrations of the mask stage 3. Each of the mask stages 3 may be additionally provided with a mask-stage analysis system and a mask-stage grating ruler. The mask-stage grating ruler may be configured to measure the position of the mask stage 3. The mask-stage analysis system may be data-connected to both the mask-stage grating ruler and the host and configured to control the operations of the mask-stage vertical actuators 3a and the mask-stage damper 3b by analyzing and processing related data. According to this embodiment, the multiple mask stages 3 may operate independently of one another, one photomask 2 is placed on each of the mask stages 3, and each photomask 2 is corresponding to an exposure region of the workpiece 6 thereunder, which forms an exposure field.

Each of the photomasks 2 may correspond to a respective one of the projection objectives 4 that operates independently of one another and are positioned under the respective photomasks 2. Each of the projection objectives may at least correspond to one exposure field, and when the projection objectives 4 are static relative to the workpiece 6, the projection objectives 4 may correspond to different exposure fields. Each of the projection objectives 4 may be provided on its side surface with a number of vertical measurement sensors 5 for measuring irregularities in the surface profile of the workpiece 6. The vertical measurement sensors 5 may be connected to the mask stages 3 and the workpiece stage 7 by cable in order to allow clock Synchronization with the both and transfer of raw data from surface profile measurements with the both. The vertical measurement sensors 5 may also be connected to the host via a network (such as an Ethernet network) in order for the transmission of raw data from surface profile measurements of the workpiece 6. The vertical measurement sensors 5 may comprise two types, i.e., Type I and Type II. The Type I sensors may be arranged at two opposing sides of the projection objectives 4 and utilized to measure the surface profile of the workpiece 6 under the projection objectives 4 and record the measured surface profile as measured light spots FLS_P, while the Type II ones may be arranged on a main base plate (i.e., the base frame 9 or a part thereof, which serves to support measurement sensors) and used to measure the surface profile of the workpiece 6 and record the measured surface profile as global leveling light spots FLS_G. The individual vertical measurement sensors 5 may be synchronized to one another using an external synchronizing bus. During alignment, both FLS_P and FLS_G may be employed to measure the surface profile of the workpiece 6. Processes of measurement are performed to obtain measurement points covering the upper surface of the workpiece 6. Each of the projection objectives 4 may be provided with a projection-objective analysis system, which is connected to the host and the vertical measurement sensors 5 and serves to receive measurement data from the vertical measurement sensors 5 and transmits them to the host. The host analyzes and processes the data and feeds it back to the projection-objective analysis system, and the projection-objective analysis system controls movements of each lens in the projection objective 4. As a result, a vertical movement of the projection objective 4 can be achieved.

The workpiece 6 is placed on the workpiece stage 7. According to the present embodiment, the workpiece 6 is a substrate with a large surface which may be partitioned into a plurality of regions each to be photoetched using one of the photomasks 2. The workpiece stage 7 may have a bottom surface on which workpiece-stage vertical actuators 7a for controlling the workpiece stage 7 to move vertically and a workpiece-stage damper 7b for damping vibrations of the workpiece stage 7 are provided. The workpiece stage 7 may also be provided with a workpiece-stage analysis system which is data-connected to the host and configured to control the operations of the workpiece-stage vertical actuators 7a and the workpiece-stage damper 7b. The vertical movements of the mask stage 3, the projection objectives 4 and the workpiece stage 7 may be performed synchronously and coordinated comprehensively so that the upper surface of the workpiece 6 which is located in an exposure region.

The marble table 8 is configured to support the workpiece stage 7 and provided with guide rails, so that the workpiece stage 7 can move with the marble table 8 in a plane parallel to the surface thereof.

The base frame 9 may include, from the top to the bottom, two platforms. Both the illumination systems 1 and the mask stages 3 may be disposed on the upper platform, while each of the projection objectives 4 may traverse the upper platform. The marble table 8 may be disposed on the lower platform, and moves within the angular field of the projection objectives 4.

The host is signal-connected to each of the mask stages 3, the projection objectives 4, the vertical measurement sensors 5 and the workpiece stage 7.

Figure 3:
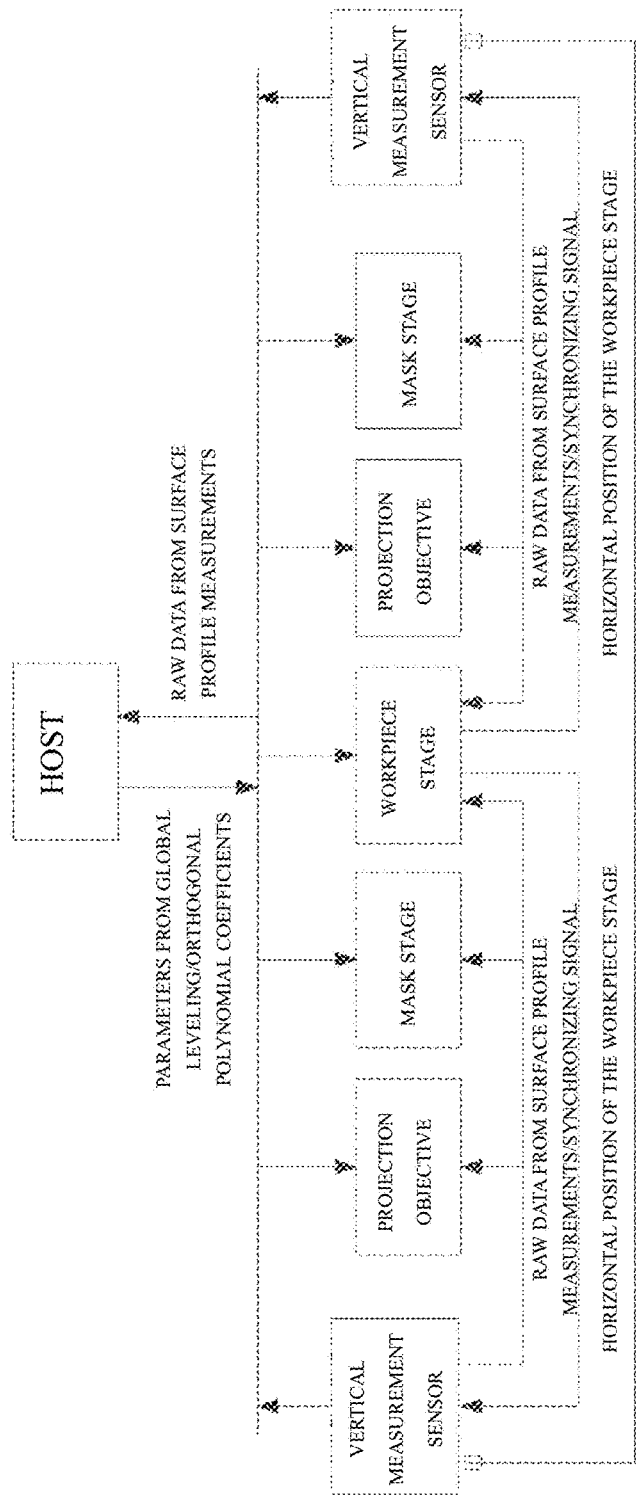
FIG. 3 is a diagram showing connections among data channels in the lithography machine under vertical control according to the first embodiment of the present disclosure.
Figure 4:
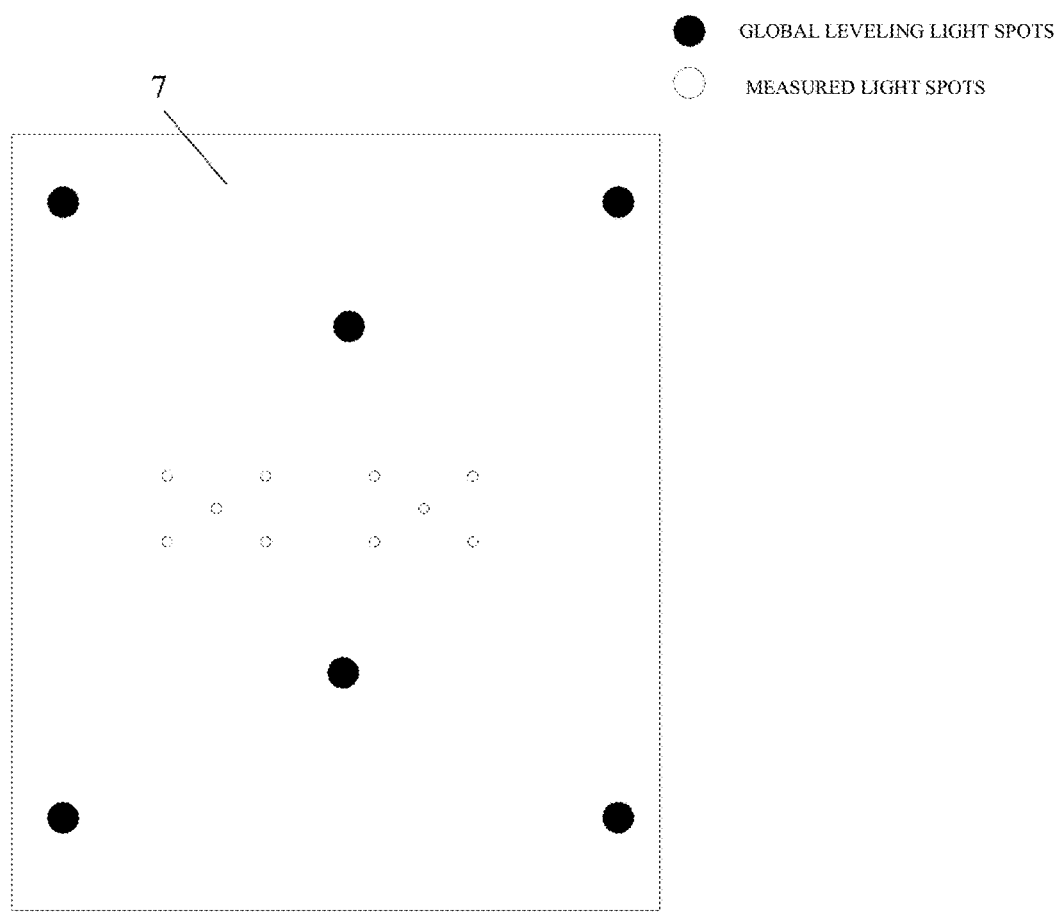
FIG. 4 schematically illustrates an arrangement of vertical measurement sensors according to the first embodiment of the present disclosure.
Figure 9:
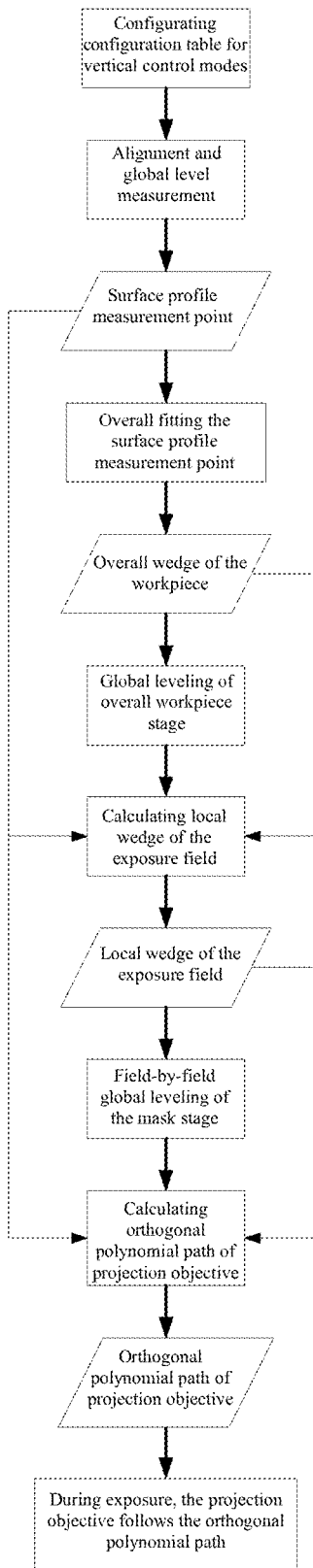
FIG. 9 shows a flowchart of a vertical control method according to the first embodiment of the present disclosure.

In embodiments disclosed herein, the host may be configured with a vertical control mode configuration table containing data organized in a structure as shown in FIG. 3. Specifically, the table may include surface profile data obtained from measurement by the vertical measurement sensors as well as the quantity of vertical movements of at least one of the projection objectives, the mask stages and the workpiece stages. The host may configure the vertical control mode as Mode 1. As shown in FIG. 9, the vertical control method carried out in Mode 1 may include the following steps.

Figure 7:
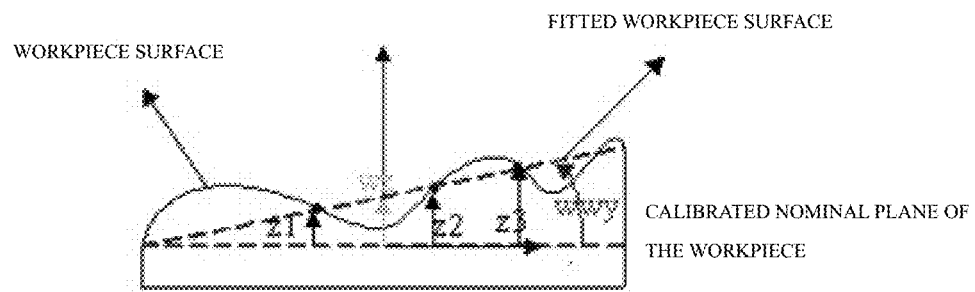
FIG. 7 is a schematic diagram of global leveling according to the first embodiment of the present disclosure.

Step 1, establishing an XYZ three-dimensional coordinate system in which an XY-plane is a horizontal plane and a Z-axis is perpendicular to the XY-plane. In on-axis and off-axis alignment of the photomasks 2 and the workpiece 6, measuring surface profile of the upper surface of the workpiece 6 by the vertical measurement sensors 5, i.e., measuring the actual coordinates of each measurement point on the upper surface of the workpiece to obtain the surface profile data of workpiece 6. In practice, a calibrated nominal plane of the workpiece may be defined for the workpiece stage 7, and as shown in FIG. 7, in the subsequent fitting processes, actual height values of the measurement points obtained from the measurement by the vertical measurement sensors 5 are values relative to the height value of the calibrated nominal plane of the workpiece.

In step 2, prior to scanning exposure is performed to the workpiece 6, performing global leveling. Generally, the global leveling may be implemented as overall global leveling, field-by-field global leveling or the combinations thereof.

Figure 8:
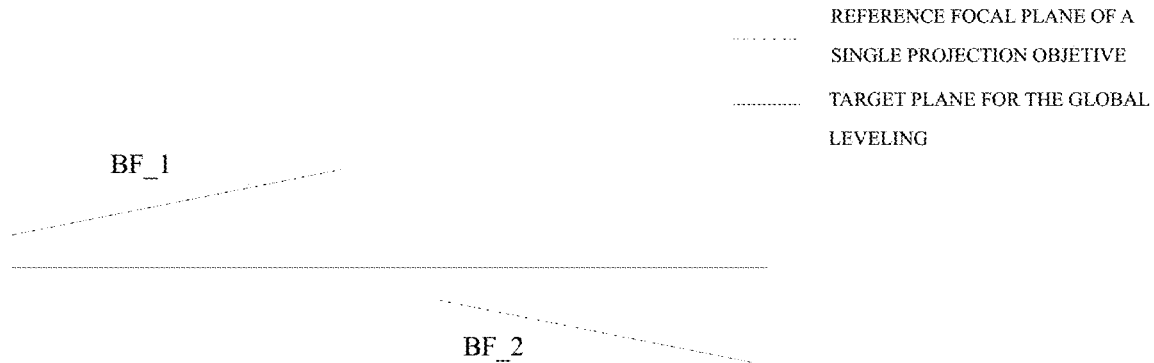
FIG. 8 shows a target plane for global leveling according to the first embodiment of the present disclosure.

The overall global leveling is intended for substantial coincidence of the overall upper surface of the workpiece 6 with a target plane for global leveling. Referring to FIG. 8, the target plane may be determined according to:

$$GLC = \frac{1}{n} * \sum_{i=1}^{n} BF\_i \quad (1)$$

where, BF_i represents reference optimum focal planes of the projection objectives 4, GLC represents the target plane, which is an average value of the reference optimum focal planes, and n represents the number of the projection objectives 4.

During overall global leveling, measurement points (xi, yi, zi) (i=1, 2, 3 . . . ) are chosen from the surface of the workpiece 6 and are all put into a plane fitting model, defined by following Eqn. (2), so that an overall wedge of the workpiece 6 can be obtained after fitting:

$$z = wz - wwy \cdot x + wwx \cdot y \ldots \quad (2)$$

where, wz represents a fitted surface height of the workpiece 6 relative to the calibrated nominal plane of the workpiece, and (wwx,wwy) represents tilts of the workpiece 6 relative to the calibrated nominal plane of the workpiece, i.e., represents the Rx-directional tilt and Ry-directional tilt, respectively.

As shown in FIG. 7, z1, z2, z3 denotes actual height values of three measurement points, wherein the number of the measurement points are selected as three as an exemplary example here but can be changed based on actual needs. By putting the positions of these measurement points (xi, yi, zi) into Eqn. (2), the height and tilts (i.e., the Rx- and Ry-tilts) of the fitted surface of the workpiece 6 in FIG. 7 relative to the calibrated nominal plane of the workpiece may be calculated according to Eqn. (2), and then amounts of adjustment to the workpiece stage 7 in the global leveling can be determined from the difference between the target plane and the overall wedge of the workpiece 6, in other words, the amounts of adjustment in the Z, Rx and Ry directions required to adjust the overall wedge to be in coincidence with the target plane may be then determined.

Field-by-field global leveling can be performed prior to scanning exposure of each exposure field, either by the workpiece stage 7 or by a corresponding one of the mask stages 3. In the former case, the height and tilts of the workpiece in the exposure field are adjusted so that the upper surface of the workpiece (characterized by the aforementioned overall wedge) comes into coincidence with the optimum focal plane of the corresponding projection objective, thus accomplishing the compensation for a local wedge of the workpiece in the exposure field. Alternatively, the local wedge may be compensated for by the mask stage 3. In this case, the mask stage 3 may be controlled to move to adjust the height and tilts of the calibrated nominal plane of the workpiece and hence of the optimum focal plane of the objective, until the optimum focal plane becomes coincident with the upper surface of the workpiece in the exposure field.

According to this embodiment, the field-by-field global leveling is accomplished with the mask stages 3. Here, the set of measurement points on the entire workpiece surface is denoted as $$\phi = \sum_{i=1}^{n} (x_i, y_i, z_i)$$

and a set obtained by removing the measurement points on the overall wedge of the workpiece 6 (i.e., those on the fitted workpiece surface in FIG. 7) from the set as $$\phi' = \sum_{i=1}^{n} (x_i', y_i', z_i').$$

The points in the subset φ' are then mapped to the individual exposure field and used to determine local wedges of the exposure field by the plane fitting model defined by Eqn. (2) (i.e., z=wz−wwy·x+wwx·y), and then the heights $wz_{Die}$, tilt $wwy_{Die}$ and tilt $wwx_{Die}$ of the local wedges relative to the calibrated nominal plane of the workpiece are obtained. The heights $wz_{Die}$ is divided by the square of the magnification N of the objective (namely, $N^2$), i.e., undergoing an image-to-object conversion, to determine the amounts of adjustment in the Z-direction for the mask stage 3. Similarly, tilt $wwy_{Die}$ and tilt $wwx_{Die}$ are divided by the square of the magnification N of the objective (namely, $N^2$), i.e., undergoing an image-to-object conversion, to determine the amounts of adjustment in the Rx direction and Ry direction for the mask stage 3.

In step 3, during scanning exposure of each exposure field, an illumination light beam emitted from the illumination system 1 passes through the photomask 2 and is then projected by the projection objective 4 onto the workpiece 6. Under the control of the host, the analysis system of the projection objective controls the optimum focal plane of the projection objective 4 to move along an orthogonal polynomial path to compensate for local surface profile of the workpiece 6 within the exposure field (in the shape of a slit according to this embodiment) so that the workpiece surface is always located within a focal depth of the projection objective 4 in the Z-direction.

Figure 10:
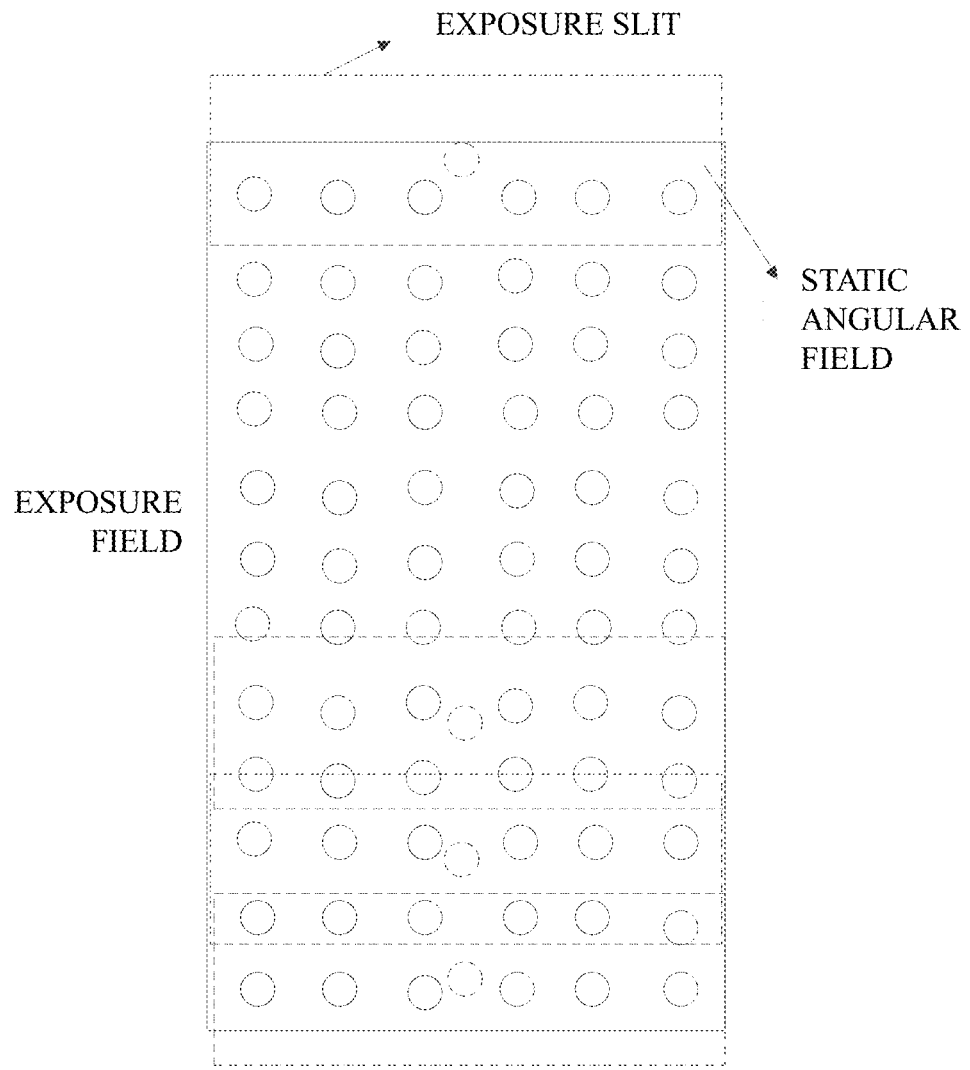
FIG. 10 is a schematic illustration of a static angular field according to the first embodiment of the present disclosure.

The orthogonal polynomial path for the optimum focal plane of the projection objective 4 may be computed as follows:

A set $$\phi'' = \sum_{i=1}^{n} (x_i'', y_i'', z_i'')$$

is obtained by removing the points on the local wedge in the exposure field from the set φ'. Assuming the exposure field is a static angular field defined by an image of a slit, which is formed by the illumination light that has passed through the slit and been irradiated on the workpiece 6. Referring to FIG. 10, the photomask 2 and the workpiece 6 both move so that the static angular field moves relatively to the workpiece region 6 from a start end to a terminal end thereof. In this process, a series of fitted values, described as $$\varphi = \sum_{i=1}^{M} (z_{i\_fit}, Rx_{i\_fit}, Ry_{i\_fit}),$$

are obtained by fitting the points which is in the static angular field and selected from the set φ" according to the plane fitting model (i.e., Eqn. (2), z=wz−wwy·x+wwx·y), where M represents the number of fitted points. The fitted values in the set φ for the aforementioned directions are further fitted by Legendre polynomials, thus deriving the orthogonal polynomial path for compensation for local surface profile of the workpiece in the static angular field, which combines a path $Z_{PO}(x)$ allowing movements of the optimum focal plane of the projection objective 4 in Z direction in the exposure field, a path $Rx_{PO}(x)$ allowing rotations of the optimum focal plane of the projection objective 4 about the X-axis in the exposure field, and a path $Ry_{PO}(y)$ allowing rotations of the optimum focal plane of the projection objective 4 about Y-axis in the exposure field, as shown in following Eqn. (3):

$$\begin{cases} z_{PO}(x) = \sum_{i=1}^{m} k_i L_i(x), m \leq 5, x \in [-1, 1] \\ Rx_{PO}(x) = \sum_{i=1}^{m} k'_i L'_i(x), m \leq 5, x \in [-1, 1] \\ Ry_{PO}(x) = \sum_{i=1}^{m} k''_i L''_i(x), m \leq 5, x \in [-1, 1] \end{cases} \quad (3)$$

where $Li(x)$, $Li'(x)$ and $Li''(x)$ represent Legendre polynomial basis functions for the paths $Z_{PO}(x)$, $Rx_{PO}(x)$ and $Ry_{PO}(y)$, respectively; ki, ki' and ki" represent orthogonal polynomial coefficients; m represents the order of the orthogonal polynomials, which is preferred to be less than or equal to 5; and x represents the horizontal position of the motion stage. For example, if the motion stage moves along the X-axis, then x is the X-directional position of the motion stage, which is preferred to lie in the range from −1 to 1.

The fitting of the fitted values for the various directions is not limited to using Legendre orthogonal polynomials, and using basis functions derived from Chebyshev polynomials or Gram-Schmidt orthonormalization is also applicable.

Figure 5:
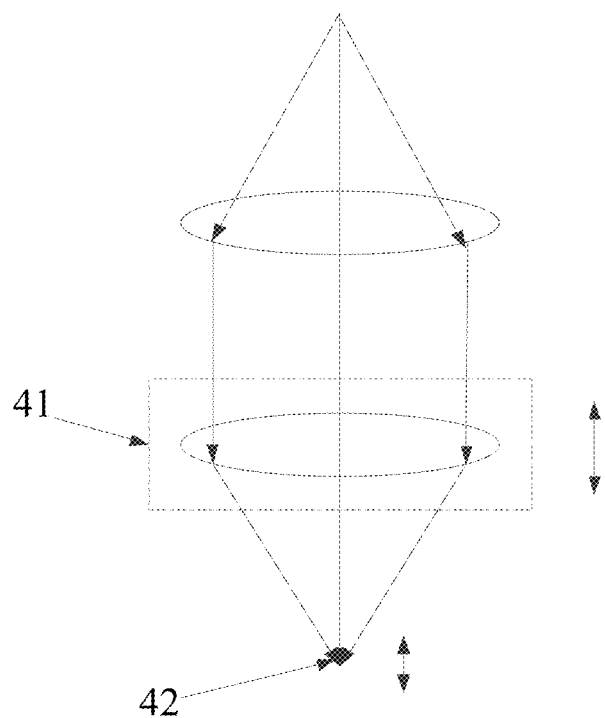
FIG. 5 is a schematic illustration of a first approach for adjusting a reference focal plane of a projection objective in accordance with the first embodiment of the present disclosure.
Figure 6:
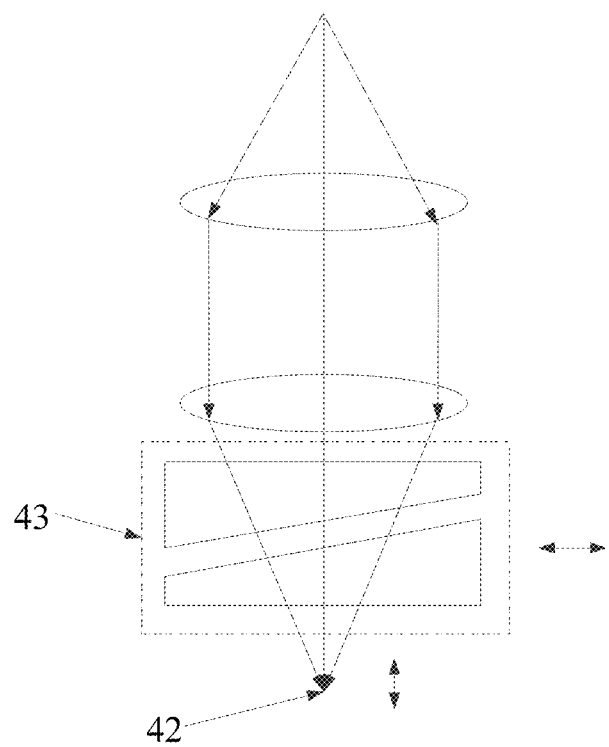
FIG. 6 is a schematic illustration of a second approach for adjusting the reference focal plane of the projection objective in accordance with the first embodiment of the present disclosure.

The optimum focal plane of the projection objective may be controlled to move along the orthogonal polynomial path in either of two possible approaches. The first approach is to vertically move a lens 41 in the projection objective 4 to cause a corresponding vertical movement of the reference focal plane 42 of the projection objective 4, as shown in FIG. 5. The second approach is to horizontally move lenses of a moveable lens group 43 of the projection objective 4 relative to each other to cause a corresponding vertical movement of the reference focal plane 42 of the projection objective 4, as shown in FIG. 6.

Embodiment 2

This embodiment differs from Embodiment 1 in that the local wedges are determined in a different way during the field-by-field global leveling by the mask stages. In particular, the surface profile data of the workpiece 6 obtained by the vertical measurement sensors are fitted to derive a curved surface profile of the workpiece 6, based on which, a first-order Taylor expansion is performed at a center of each exposure field to determine the local wedge (Zi_wedge, Rxi_wedge, Ryi_wedge) of the exposure field. An image-to-object conversion is then achieved by dividing the height component of the local wedge relative to the calibrated nominal plane of the workpiece, i.e., Zi_wedge, by the square of the objective magnification N, so that an amount of adjustment in Z direction can be obtained. Similarly, an image-to-object conversion is achieved by dividing the tilt component of the local first-order wedge relative to the calibrated nominal plane of the workpiece, i.e., Rxi_wedge and Ryi_wedge, by the square of the objective magnification N, so that amounts of adjustment in the Rx and Ry directions can also be obtained. During scanning exposure, the field-by-field global leveling can be accomplished by the mask stages 3 based on those amounts of vertical adjustment for each exposure filed.

Embodiment 3

Figure 13:
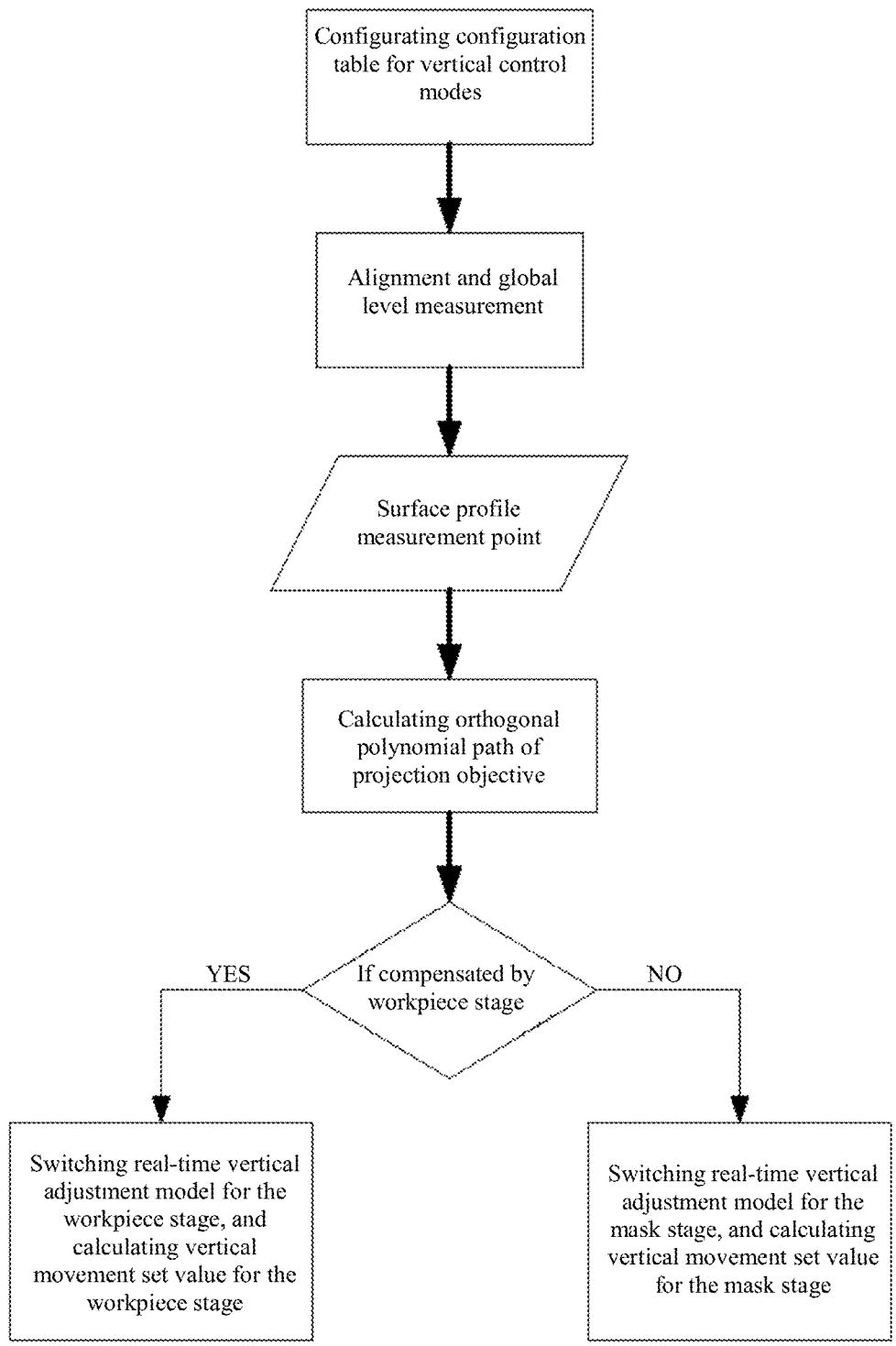
FIG. 13 shows a flowchart of a vertical control method according to the third embodiment of the present disclosure.

Referring to FIG. 13, this embodiment differs from Embodiment 1 in that, in step 2, the workpiece stage 7 is configured to move to accomplish field-by-field global leveling. First of all, a commonly-used curve fitting algorithm may be employed to determine a curved surface profile z=f(x,y) of the workpiece 6 from all the measurement points on the workpiece surface. A linear interpolation is then performed on the fitted curved surface profile, and all the interpolated points distributed throughout the upper surface of the workpiece 6 are mapped to the exposure fields. As a result, in each of the exposure fields, a vertical set value for the workpiece stage 7 at a certain horizontal position ($x_i$, $y_i$) can be obtained by putting a corresponding interpolated point within a static angular field into the plane fitting model defined by Eqn. (2), as shown in FIG. 10. In case of a lithography machine with multiple mask stages, scanning exposure of multiple exposure fields can be carried out at the same time, so linearly interpolated points in the static exposure fields in these regions can be simultaneously processed by the plane fitting model to obtain a vertical movement set value for the workpiece stage 7. Subsequently, the so-obtained vertical movement set value for the workpiece stage 7 are fitted using Legendre polynomials to derive a Legendre orthogonal polynomial path for the workpiece stage 7 within the exposure field, which combines a path $Z_{PS}(x)$ allowing movements of the workpiece stage 7 in Z direction in the exposure field, a path $Rx_{PS}(x)$ allowing rotations of the workpiece stage 7 about the X-axis in the exposure field, and a path $Ry_{PS}(y)$ allowing rotations of workpiece stage 7 about Y-axis in the exposure field, as shown in following Eqn. (6):

$$\begin{cases} z_{PS}(x) = \sum_{i=1}^{m} k_i L_i(x), m \leq 5, x \in [-1, 1] \\ Rx_{PS}(x) = \sum_{i=1}^{m} k'_i L'_i(x), m \leq 5, x \in [-1, 1] \\ Ry_{PS}(x) = \sum_{i=1}^{m} k''_i L''_i(x), m \leq 5, x \in [-1, 1] \end{cases} \quad (6)$$

where $Li(x)$, $Li'(x)$ and $Li''(x)$ represent Legendre polynomial basis functions for the paths $Z_{PS}(x)$, $Rx_{PS}(x)$ and $Ry_{PS}(y)$, respectively; ki, ki' and ki" represent orthogonal polynomial coefficients; m represents the order of the orthogonal polynomials, which is preferred to be less than or equal to 5; and x represents the horizontal position of the motion stage. For example, if the motion stage moves along the X-axis, then x is the X-directional position of the motion stage, which is preferred to lie in the range from −1 to 1.

The fitting of the fitted values for the various directions is not limited to using Legendre orthogonal polynomials, and a method using basis functions derived from Chebyshev polynomials or Gram-Schmidt orthonormalization is also applicable.

In step 3, during exposure, based on the actual conditions, the host may decide to perform the real-time compensation either by the workpiece stage 7 or by the mask stage. In the former case, a real-time vertical adjustment model for the workpiece stage 7 shall be calculated out, and also a vertical movement set value for the workpiece stage 7 may be calculated, so that in scanning exposure, the host controls, in real time, the workpiece-stage analysis system and thus the workpiece-stage vertical actuators 7a so that the vertical movement of the workpiece stage 7 is controlled in real time to compensate for surface profile irregularities of the workpiece 6. In case the host chooses to perform real-time compensation by the mask stage 3, a real-time vertical adjustment model for the mask stage 3 shall be calculated out, and also a vertical movement set value for the mask stage 3 may be calculated out, in scanning exposure, the host controls, in real time, the mask-stage analysis system and thus the mask-stage vertical actuators 3a so that the vertical movement of the mask stage 3 is controlled in real time to compensate for surface profile irregularities of the workpiece 6.

Figure 11:
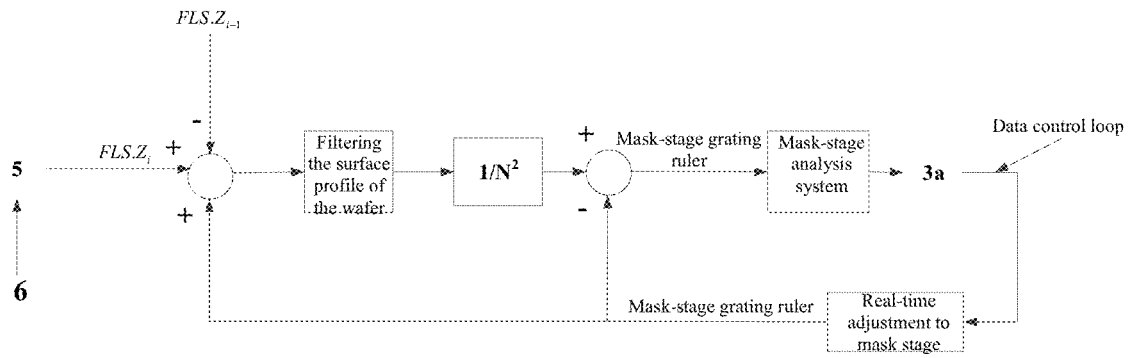
FIG. 11 is a schematic illustration of a vertical control architecture for local surface profile compensation for a workpiece by means of adjusting a mask stage in accordance with a third embodiment of the present disclosure.

In this embodiment, the host may be configured to perform vertical control in Mode 2. As shown in FIG. 11, during scanning exposure of the workpiece 6, if the host chooses to compensate for vertical height or tilts by the mask stage 3, then for each exposure field, the vertical movement of the mask stage 3 is adjusted in real time so that the optimum focal plane, which keeps changing in real time through the process, always remains in coincidence with the workpiece surface portion within the exposure slit (i.e., the static angular field).

In order to perform Z-directional compensation to the workpiece surface through vertical movement of the mask stage, for each exposure field, a desired amount of Z-directional adjustment for the mask stage at the start point of the exposure field may be determined as $1/N^2*(FLS.Z_1-BF\_Die.Z)$, where $FLS.Z_1$ represents data obtained by the vertical measurement sensors about the Z-directional surface profile of the workpiece at the start point; $BF\_Die.Z$ represents a Z-directional set value of focal plane for each exposure field, which can be determined by factors including the reference focal plane for the projection objective, a user-defined amount of defocus and an amount of thermal compensation; and N represents the magnification of the projection objective. A desired amount of Z-directional adjustment for the mask stage during scanning exposure can be determined as $1/N^2*(FLS.Z_i-FLS.z_{i-1})$, where $FLS.Z_i$ represents data obtained by the vertical measurement sensors about the Z-directional surface profile of the workpiece in the current sampling cycle, and $FLS.Z_{i-1}$ represents data obtained by the vertical measurement sensors about the Z-directional surface profile of the workpiece in the previous sampling cycle.

Rx-directional compensation for the workpiece surface through vertical movement of the mask stage can be performed in the following manner:

A desired amount of Rx-directional adjustment for the mask stage at the start point of each exposure field may be determined as $1/N*(FLS.Rx_1-BF\_Die.Rx)$, where $FLS.Rx_1$ represents data obtained by the vertical measurement sensors about the Rx-directional surface profile of the workpiece at the start point; $BF\_Die.Rx$ represents an Rx-directional set value of focal plane for each exposure field; and N represents the magnification of the projection objective. A desired amount of Rx-directional adjustment for the mask stage during scanning exposure can be determined as $1/N*(FLS.Rx_i-FLS.Rx_{i-1})$, where $FLS.Rx_i$ represents data obtained by the vertical measurement sensors about the Rx-directional surface profile of the workpiece in the current sampling cycle, and $FLS.Rx_{i-1}$ represents data obtained by the vertical measurement sensors about the Rx-directional surface profile of the workpiece in the previous sampling cycle.

Ry-directional compensation for the workpiece surface through vertical movement of the mask stage can be performed in the following manner:

A desired amount of Ry-directional adjustment for the mask stage at the start point of each exposure field may be determined as $1/N*(FLS.Ry_1-BF\_Die.Ry)$, where $FLS.Ry_1$ represents an Ry-directional tilt value of the data obtained by the vertical measurement sensors about the surface profile of the workpiece at the start point; $BF\_Die.Ry$ represents an optimum Ry-directional set value of focal plane for the exposure field; and N represents the magnification of the projection objective. A desired amount of Ry-directional adjustment for the mask stage during scanning exposure can be determined as $1/N*(FLS.Ry_i-FLS.Ry_{i-1})$, where $FLS.Ry_i$ represents an Ry-directional tilt value of the data obtained by the vertical measurement sensors about the surface profile of the workpiece in the current sampling cycle, and $FLS.Ry_{i-1}$ represents an Ry-directional tilt value of the data obtained by the vertical measurement sensors about the surface profile of the workpiece in the previous sampling cycle; and N represents the magnification of the projection objective.

In order to ensure that the mask stage 3 moves vertically fully according to the vertical movement set value, it is also desired to take into account a bandwidth for the vertical movement of the mask stage 3. To this end, the vertical movement set value for the mask stage 3 may be filtered so that the filtered vertical movement set value can be used as the vertical movement set for the mask stage 3.

With continued reference to FIG. 11, when it is configured to compensate for the surface profile of the workpiece 6 by controlling in real time the vertical movement of the mask stage 3, a real-time data control process may be employed, which starts with the calculation of an amount of real-time vertical movement for the mask stage 3 by the host. The calculated amount is transmitted to the mask-stage vertical actuators 3a and serves as a basis for the latter to adjust the vertical position of the mask stage 3. After that, the mask-stage grating ruler measures the adjusted position of the mask stage 3 in real time and feeds data about the measured position back to the host. At this point, additional data are also fed back to the host, which include differences between measurements obtained from adjacent two vertical measurement sensors 5 that have been processed by surface-profile filtering and the projection objective 4 and those differences not so processed. In this way, the vertical movement of the mask stage 3 can be precisely controlled by adjusting the position of the mask stage 3 in real time and feeding back to the host the real-time position measurements obtained by the mask-stage grating ruler before and after the adjustment.

In the case that the mask stages 3 are not used for local surface profile compensation for the workpiece 6, during the scanning exposure of each exposure field, the reference optimum focal plane for the objective always is fixed. At this point, a calibrated nominal plane of the workpiece may be defined, and the mask stage 3 will move towards the calibrated nominal plane of the workpiece. When it is desired to use the mask stage 3 to perform vertical movement compensation, the vertical movement set value for the mask stage 3 may be obtained by adding a vertical movement set value for its vertical movement towards the nominal workpiece plane and the amounts of its vertical adjustment, as shown in following Eqn. (7):

$$Ver_{RS\_set}=Ver_{RS\_ref}+\Delta Ver \ldots \quad (7)$$

where, $Ver_{RS\_ref}$ represents the vertical movement set value for the vertical movement of mask stage 3 towards the calibrated nominal plane of the workpiece; $\Delta Ver$, the amounts of vertical adjustment for the mask stage 3; and $Ver_{RS\_set}$, the actual vertical movement set value for the mask stage 3 in real-time adjustment.

Embodiment 4

This embodiment differs from Embodiment 3 in that the host is configured to perform vertical control in Mode 3, which differs from Mode 2 as follows:

In step 3, during scanning exposure of the workpiece 6, its local surface profile is compensated for by means of real-time vertical movement of the workpiece stage 7. In this case, the optimum focal plane for each exposure field is fixed in position (i.e., in height or tilts), and the vertical movement of the workpiece stage 7 is adjusted so that the workpiece surface in the exposure slit area can be coincident with the optimum focal plane.

When it is configured that the workpiece stage 7 is vertically moved in real time to perform surface profile compensation for the workpiece 6, a difference between a Z-directional surface profile data obtained by the vertical measurement sensors 5 in the current sampling cycle and a Z-directional set value of the focal plane for each exposure field, i.e., an amount of Z-directional adjustment of workpiece stage during the scanning exposure, may be expressed as (FLS.$Z_i$-BF_Die.Z), where FLS.$Z_i$ represents the Z-directional height value of the surface profile data obtained by the vertical measurement sensors 5 in the current sampling cycle, and BF_Die.Z represents the Z-directional set value of the optimum focal plane for the exposure field. When the local surface profile compensation is performed by the workpiece stage 7 during the scanning exposure, it is desired to add the amount of Z-directional height adjustment to a Z-directional height corresponding to the horizontal position (xi, yi) in the orthogonal polynomial path for the workpiece stage 7 so that a Z-directional height set value for the vertical movement of workpiece stage 7 can be achieved.

The configuration of the workpiece stage to move vertically to compensate for the Rx-directional tilt value for the local surface profile of the workpiece is performed. Specifically, the workpiece stage may be adjusted in the Rx-direction during the scanning exposure by an amount of (FLS.$X_i$–BF_Die.X), where FLS.$X_i$ represents an Rx-directional set value of the data obtained by the vertical measurement sensors about the surface profile in the current sampling cycle, and BF_Die.X represents an Rx-directional set value of the optimum focal plane for the exposure field. In addition, the configuration of the workpiece stage to move vertically to compensate for the Ry-directional tilt value for the local surface profile of the workpiece is performed. Specifically, the workpiece stage may be adjusted in the Ry-direction during the scanning exposure by an amount of (FLS.$Y_i$–BF_Die.Y), where represents an Ry-directional set value of the data obtained by the vertical measurement sensors about the surface profile in the current sampling cycle, and BF_Die.Y represents an Ry-positional set value of the optimum focal plane for the exposure field. Similarly, in order to ensure that the workpiece stage 7 moves vertically fully according to the vertical movement set value, it is desired to filter the vertical movement set value so that the filtered vertical movement set value can be used as the vertical movement set value of the workpiece stage 7.

Figure 12:
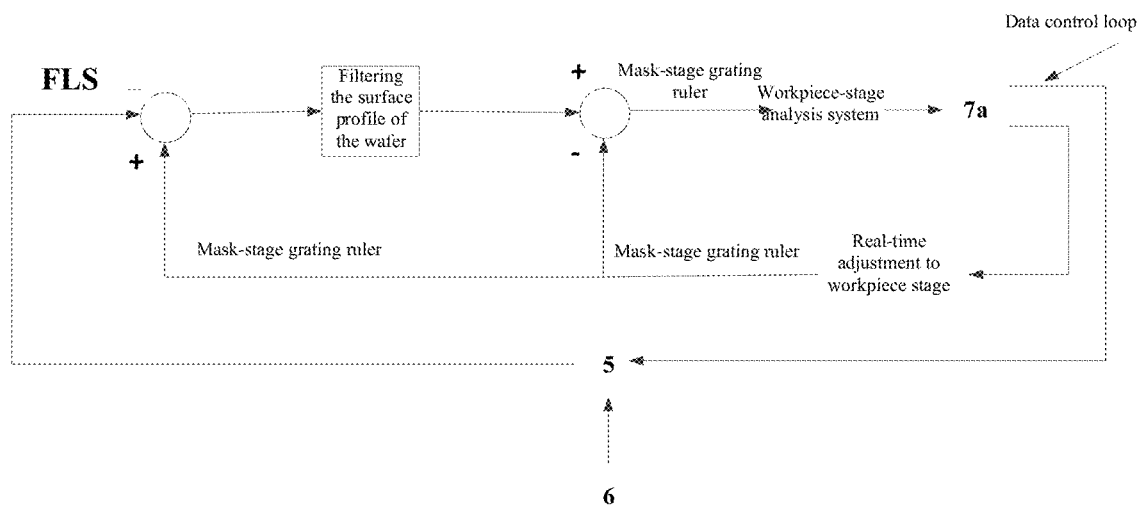
FIG. 12 is a schematic illustration of a vertical control architecture for local surface profile compensation for a workpiece by means of adjusting a workpiece stage in accordance with a fourth embodiment of the present disclosure.

Accordingly, referring to FIG. 12, when it is configured to compensate for the surface profile of the workpiece 6 by controlling in real time the vertical movement of the workpiece stage 7, a real-time data control process may be employed, which comprises the following. The data obtained by the vertical measurement sensors 5 is processed under surface-profile filtering by the host. The filter data are then processed by the workpiece-stage analysis system, together with real-time position data about the workpiece stage 7 from a workpiece-stage grating ruler, to derive a real-time vertical movement scheme for the workpiece stage 7. The scheme is provided to the workpiece-stage vertical actuators 7a, which then adjust vertical movement of the workpiece stage 7 in real time. Subsequently, the workpiece-stage grating ruler again measures and obtains real-time position data about the workpiece stage 7 and feeds the data back to the host. At this point, additional data are also fed back to the host, which include data about the positions of measurement points on the workpiece 6 measured by the vertical measurement sensors 5 and such data that have undergone surface-profile filtering in the host and output. Therefore, the data control process provides a data loop capable of measuring the surface profile of the workpiece 6 and the position of the workpiece stage 7 and adjusting the vertical movement of the workpiece stage 7 in real time.

During scanning exposure in which a real-time adjustment algorithm for vertical movement of the mask stage 3 is applied. The position (i.e., height or tilts) of optimum focal plane changes in real time. In this case, vertical movement of the mask stage 3 can be adjusted so that, in the static angular field, the optimum focal plane is coincident with the upper surface of the workpiece 6. In the scheme with the vertical movement of the workpiece stage 7 being adjusted in real time, during scanning exposure in which a real-time adjustment algorithm for vertical movement of the workpiece stage 7 is applied, the optimum focal plane is fixed in position (i.e., in height or tilts) for each exposure field. In this case, vertical movement of the workpiece stage 7 can be adjusted in real time so that, in the static exposure field, the upper surface of the workpiece 6 is coincident with the optimum focal plane.

For a large workpiece, it is difficult to achieve a high bandwidth for vertical movement of the workpiece stage for its surface profile compensation in terms of both design and fabrication. By contrast, the mask stage 3 is lighter in weight and allows a higher vertical movement bandwidth. Therefore, it is sensible to compensate for low-frequencies components for surface profile irregularities of the workpiece 6 by adjusting the workpiece stage 7 and compensate for high-frequency components by adjusting the mask stage 3. In this way, surface profile compensation can be achieved for any workpiece without increasing fabrication difficulties.

Embodiment 5

This embodiment differs from Embodiment 3 in local wedge calculation for field-by-field global leveling by the workpiece stage. Specifically, surface profile data about the workpiece 6 obtained by the vertical measurement sensors are fitted to obtain a curved surface profile of the workpiece 6, based on which, a local first-order wedge for each exposure field is derived by performing a Taylor expansion at a center of each exposure field. During scanning exposure, the workpiece stage 6 performs the field-by-field global leveling based on the local first-order wedges for each exposure field.

To sum up, according to the present disclosure, local surface profile compensation for a workpiece in the Z, Rx and Ry directions can be accomplished in a flexible, configurable manner during exposure by choosing one of multiple possible schemes based on actual conditions such as the bandwidths of the workpiece and mask stages.

While the present disclosure has been described above with reference to the foregoing embodiments, it is not limited to these embodiments disclosed. It is apparent that those skilled in the art can make various modifications and variations to the present disclosure without departing from the spirit and scope thereof. Accordingly, the disclosure is intended to embrace all such modifications and variations if they fall within the scope of the appended claims and equivalents thereof.

What is claimed is:

1. A method for vertical control of a lithography machine, wherein the lithography machine comprises, from top to bottom, illumination systems, mask stages, projection objectives and a workpiece stage, each mask stage corresponding to one of the projection objectives, the method comprising the steps of:

step 1, prior to a scanning exposure, controlling vertical measurement sensors to measure a workpiece to obtain overall surface profile data of the workpiece;

step 2, performing a global leveling based on the overall surface profile data of the workpiece; and step 3, during the scanning exposure of each exposure field, measuring a local surface profile of the workpiece in real time by the vertical measurement sensors and controlling at least one of the mask stages, the workpiece stage and the projection objectives conduct a vertical movement according to a Z-directional height value, an Rx-directional tilt value and an Ry-directional tilt value corresponding to the local surface profile of the workpiece, to compensate for the local surface profile of the workpiece in real time, so that an upper surface of each exposure field coincides with a reference focal plane for the exposure field, wherein the vertical movement is performed by:

configuring the workpiece stage to perform an overall global leveling, configuring the mask stages to perform a field-by-field global leveling, and controlling the mask stages to conduct the vertical movement to compensate for the local surface profile of the workpiece in real time; or configuring the workpiece stage to perform a field-by-field global leveling and controlling the mask stages to conduct the vertical movement to compensate for the local surface profile of the workpiece in real time.

2. The method for vertical control of a lithography machine according to claim 1, wherein step 2 comprises: fitting the surface profile data of the workpiece to obtain a global plane surface profile; and deriving vertical movement control parameters for the global leveling based on differences between the global plane surface profile and a target plane for the global leveling, and controlling, prior to the exposure, vertical movements of the workpiece stage to perform an overall global leveling according to the vertical movement control parameters for the global leveling, and wherein the target plane for the global leveling is an optimum focal plane for the projection objective.

3. The method for vertical control of a lithography machine according to claim 2, wherein the lithography machine comprises a plurality of projection objectives, and the target plane for the global leveling is an average of optimum focal planes for the plurality of projection objectives.

4. The method for vertical control of a lithography machine according to claim 1, wherein step 2 comprises: prior to the scanning exposure of each exposure field, performing fitting based on the surface profile data to obtain a local wedge for each exposure field; and controlling the workpiece supported by the workpiece stage to conduct a field-by-field global leveling based on the local wedge for each exposure field.

5. The method for vertical control of a lithography machine according to claim 4, wherein performing fitting based on the overall surface profile data to obtain a local wedge for each exposure field comprises:

performing a curved surface fitting to the overall surface profile data to obtain a curved surface profile of the workpiece, based on which, the local wedge for each exposure field is obtained from a first-order Taylor expansion performed at a center of each exposure field.

6. The method for vertical control of a lithography machine according to claim 4, wherein, prior to scanning exposure each exposure field, performing fitting based on the overall surface profile data to obtain a local wedge for each exposure field and controlling the workpiece supported by the workpiece stage to conduct a field-by-field global leveling based on the local wedge for each exposure field comprises:

performing a curved surface fitting to the overall surface profile data to obtain a curved surface profile of the workpiece, based on which, a linear interpolation is performed to obtain interpolated points distributed throughout an upper surface of the workpiece; mapping corresponding ones of the interpolated points to each exposure field; in each exposure field, performing plane fitting to the mapped interpolated points within a static angular field moving from a start point to a finish point of the exposure field to obtain vertical movement fitted values of the exposure field during movement of the static angular field; performing orthogonal polynomials fitting based on the vertical movement fitted values to obtain an orthogonal polynomial path of the workpiece stage in Z direction, Rx direction, and Ry direction; and controlling the workpiece stage to move according to the orthogonal polynomial path to perform the field-by-field global leveling.

7. The method for vertical control of a lithography machine according to claim 6, wherein the orthogonal polynomial comprises a basis function derived from Legendre polynomials, Chebyshev polynomials or Gram-Schmidt orthogonalization.

8. The method for vertical control of a lithography machine according to claim 1, wherein step 2 comprises: prior to scanning exposure of each exposure field, performing fitting based on the overall surface profile data to obtain a local wedge for each exposure field; dividing a Z-directional height value corresponding to the local wedge by square of a magnification of the projection objective, dividing an Rx-directional tilt value corresponding to the local wedge by the magnification of the projection objective, and dividing an Ry-directional tilt value corresponding to the local wedge by the magnification of the projection objective, so that an image-to-object conversion of the local wedge is accomplished; controlling the mask stage to conduct a field-by-field global leveling based on the local wedge after image-to-object conversion.

9. The method for vertical control of a lithography machine according to claim 8, wherein step 2 further comprises: during scanning exposure of each exposure field, controlling the projection objective to move along an orthogonal polynomial path to compensate for the local surface profile of the workpiece.

10. The method for vertical control of a lithography machine according to claim 9, wherein performing fitting based on the overall surface profile data to obtain a local wedge for each exposure field comprises:

performing a plane fitting to the overall surface profile data to obtain a global plane surface profile of the workpiece; calculating differences between the global plane surface profile and a target plane for the global leveling; subtracting the differences from the overall surface profile data of the workpiece to obtain a set $\phi'$ of points; mapping corresponding ones of the points in the set $\phi'$ to each exposure field; and performing plane fitting to data of the exposure field to obtain the local wedge for the exposure field, wherein the target plane for the global leveling is an optimum focal plane for the projection objective.

11. The method for vertical control of a lithography machine according to claim 10, wherein controlling the projection objective to move along an orthogonal polynomial path to compensate for the local surface profile of the workpiece comprises:

removing the local wedge for the exposure field from the set $\phi'$; performing plane fitting to the data in the static angular field moving from a start point to a finish point of the exposure field, to obtain vertical movement fitted values of the exposure field during movement of the static angular field; performing orthogonal polynomials fitting based on the vertical movement fitted values to obtain an orthogonal polynomial path of the workpiece stage in Z direction, Rx direction, and Ry direction; and controlling the optimum focal plane for the projection objective to move according to the orthogonal polynomial path to compensate for the local surface profile of the workpiece within the static angular field.

12. The method for vertical control of a lithography machine according to claim 1, wherein step 3 comprises configuring the mask stage to move vertically to compensate for the Z-directional height value corresponding to the local surface profile of the workpiece, wherein the compensation of the Z-directional height value comprises:

applying, to the mask stage at a start point of each exposure field, a Z-directional adjustment in an amount of $1/N^2*(FLS.Z_1-BF\_Die.Z)$, where $FLS.Z_1$ represents a Z-directional height value of the surface profile data obtained by the vertical measurement sensors at the start point of the exposure field; $BF\_Die.Z$ represents a Z-directional set value for an optimum focal plane for the exposure field; and N represents a magnification of the projection objective; and applying, to the mask stage during the scanning exposure, a Z-directional adjustment in an amount of $1/N^2*(FLS.Z_i-BF\_Die.Z_{i-1})$, where $FLS.Z_i$ represents a Z-directional height value of the surface profile data obtained by the vertical measurement sensors within a current sampling cycle; $FLS.Z_{i-1}$ represents a Z-directional height value of the surface profile data obtained by the vertical measurement sensors within a previous sampling cycle; and N represents the magnification of the projection objective.

13. The method for vertical control of a lithography machine according to claim 12, wherein during scanning exposure of each exposure field, actual vertical movement values of the mask stage are obtained by adding vertical movement set values for movements of the mask stage towards a calibrated nominal plane of the workpiece and the amounts of adjustment for compensating for the local surface profile of the workpiece.

14. The method for vertical control of a lithography machine according to claim 12, wherein during scanning exposure of each exposure field, actual vertical movement values of the mask stage are obtained by adding vertical movement set values for movements of the mask stage towards a calibrated nominal plane of the workpiece and the amounts of adjustment for compensating for the local surface profile of the workpiece, which have been filtered.

15. The method for vertical control of a lithography machine according to claim 1, wherein step 3 comprises configuring the mask stage to move vertically to compensate for the Rx-directional tilt value corresponding to the local surface profile of the workpiece, wherein the compensation of the Rx-directional tilt value comprises:

applying, to the mask stage at a start point of each exposure field, an Rx-directional adjustment in an amount of $1/N*(FLS.RX_1-BF\_Die.RX)$, where $FLS.RX_1$ represents an Rx-directional tilt value of the surface profile data obtained by the vertical measurement sensors at the start point of the exposure field; $BF\_Die.Rx$ represents an Rx-directional set value for an optimum focal plane for the exposure field; and N represents a magnification of the projection objective; and applying, to the mask stage during the scanning exposure, an Rx-directional adjustment in an amount of $1/N*(FLS.Rx_i-FLS.Rx_{i-1})$, where $FLS.Rx_i$ represents an Rx-directional tilt value of the surface profile data obtained by the vertical measurement sensors within a current sampling cycle; $FLS.Rx_{i-1}$ represents an Rx-directional tilt value of the surface profile data obtained by the vertical measurement sensors within a previous sampling cycle; and N represents the magnification of the projection objective.

16. The method for vertical control of a lithography machine according to claim 1, wherein step 3 comprises configuring the mask stage to move vertically to compensate for the Ry-directional tilt value corresponding to the local surface profile of the workpiece, wherein the compensation of the Ry-directional tilt value comprises:

applying, to the mask stage at a start point of each exposure field, an Ry-directional adjustment in an amount of $1/N*(FLS.Ry_1-BF\_Die.Ry)$, where $FLS.Ry_1$ represents an Ry-directional tilt value of the surface profile data obtained by the vertical measurement sensors at the start point of the exposure field; $BF\_Die.Ry$ represents an Ry-directional set value for an optimum focal plane for the exposure field; and N represents a magnification of the projection objective; and applying, to the mask stage during the scanning exposure, an Ry-directional adjustment in an amount of $1/N*(FLS.Ry_i-FLS.Ry_{i-1})$, where $FLS.Ry_i$ represents an Ry-directional tilt value of the surface profile data obtained by the vertical measurement sensors within a current sampling cycle; $FLS.RY_{i-1}$, an Ry-directional tilt value of the surface profile data obtained by the vertical measurement sensors within a previous sampling cycle; and N represents the magnification of the projection objective.

17. The method for vertical control of a lithography machine according to claim 1, wherein step 3 comprises configuring the workpiece stage to move vertically to compensate for the Z-directional height value corresponding to the local surface profile of the workpiece, wherein the compensation of the Z-directional height value comprises:

applying, to the workpiece stage during the scanning exposure, a Z-directional adjustment in an amount of $(FLS.Z_i-BF\_Die.Z)$, where $FLS.Z_i$ represents a Z-directional height value of the surface profile data obtained by the vertical measurement sensors within the current sampling cycle, and $BF\_Die.Z$ represents a Z-directional set value of an optimum focal plane for the exposure field.

18. The method for vertical control of a lithography machine according to claim 1, wherein step 3 comprises configuring the workpiece stage to move vertically to compensate for the Rx-directional tilt value corresponding to the local surface profile of the workpiece, wherein the compensation of the Rx-directional tilt value comprises:

applying, to the workpiece stage during the scanning exposure, an Rx-directional adjustment in an amount of ($FLS.X_i$–$BF\_Die.X$), where $FLS.X_i$ represents an Rx-directional tilt value of the surface profile data obtained by the vertical measurement sensors within the current sampling cycle, and $BF\_Die.X$ represents an Rx-directional set value of an optimum focal plane for the exposure field.

19. The method for vertical control of a lithography machine according to claim 1, wherein step 3 comprises configuring the workpiece stage to move vertically to compensate for the Ry-directional tilt value corresponding to the local surface profile of the workpiece, wherein the compensation of the Ry-directional tilt value comprises:

applying, to the workpiece stage during the scanning exposure, an Ry-directional adjustment in an amount of ($FLS.Y_i$–$BF\_Die.Y$), where $FLS.Y_i$ represents an Ry-directional tilt value of the surface profile data obtained by the vertical measurement sensors within the current sampling cycle, and $BF\_Die.Y$ represents an Ry-directional set value of an optimum focal plane for the exposure field.

20. The method for vertical control of a lithography machine according to claim 1, wherein the vertical movement comprises one or combinations of Z-directional movements, Rx-directional movements and Ry-directional movements, and wherein in step 3, controlling at least one of a mask stage, a workpiece stage and a projection objective to move vertically according to a Z-directional height value, an Rx-directional tilt value and an Ry-directional tilt value corresponding to the local surface profile of the workpiece comprises any one of modes as follows:

the workpiece stage is configured to move vertically to compensate for the Z-directional height value, the Rx-directional tilt value and the Ry-directional tilt value corresponding to the local surface profile of the workpiece; and at same time, the mask stage is configured to move towards a calibrated nominal plane of the workpiece; or the workpiece stage is configured to move vertically to compensate for the Z-directional height value and the Ry-directional tilt value corresponding to the local surface profile of the workpiece; and at same time, the mask stage is configured so that a Z-directional degree of freedom of the mask stage moves towards a calibrated nominal plane of the workpiece, and the mask stage is configured to move vertically to compensate for the Rx-directional tilt value and the Ry-directional tilt value corresponding to the local surface profile of the workpiece; or the workpiece stage is configured to move vertically to compensate for the Z-directional height value, the Rx-directional tilt value and the Ry-directional tilt value corresponding to the local surface profile of the workpiece; and at same time, the mask stage is configured so that a Z-directional degree of freedom of the mask stage moves towards a calibrated nominal plane of the workpiece, and the mask stage is configured to move vertically to compensate for the Ry-directional tilt value corresponding to the local surface profile of the workpiece; or the workpiece stage is configured to move towards a target plane for the global leveling; and at same time the mask stage is configured to move vertically to compensate for the Z-directional height value, the Rx-directional tilt value and the Ry-directional tilt value corresponding to the local surface profile of the workpiece; or an optimum focal plane for the projection objective is configured to move vertically to compensate for the Z-directional height value, the Rx-directional tilt value and the Ry-directional tilt value corresponding to the local surface profile of the workpiece.

* * * * *